(12) United States Patent
Nag et al.

(10) Patent No.: US 11,018,692 B2
(45) Date of Patent: *May 25, 2021

(54) FLOATING POINT DATA SET COMPRESSION

(71) Applicant: HEWLETT PACKARD ENTERPRISE DEVELOPMENT LP, Houston, TX (US)

(72) Inventors: Anirban Nag, Palo Alto, CA (US); Naveen Muralimanohar, Palo Alto, CA (US); Paolo Faraboschi, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/942,293

(22) Filed: Jul. 29, 2020

(65) Prior Publication Data

US 2020/0358455 A1    Nov. 12, 2020

Related U.S. Application Data

(63) Continuation of application No. 16/131,722, filed on Sep. 14, 2018, now Pat. No. 10,756,756.

(51) Int. Cl.
*H03M 7/30* (2006.01)
*H03M 7/24* (2006.01)

(52) U.S. Cl.
CPC ........... *H03M 7/3059* (2013.01); *H03M 7/24* (2013.01); *H03M 7/3071* (2013.01)

(58) Field of Classification Search
CPC .... H03M 7/30; H03M 7/3059; H03M 7/3071; H03M 7/3073; H03M 7/3075;
(Continued)

(56) References Cited

U.S. PATENT DOCUMENTS 9,385,751 B2    7/2016  Kletter
2014/0313064 A1*  10/2014  Shibata  ............... H03M 7/3073
                                               341/87

OTHER PUBLICATIONS

D. Patterson el al., Computer Organization and Design, the Hardware/ Software Interface, Elsevier, 3rd ed., 2005 (Year: 2005).*

(Continued)

*Primary Examiner* — Andrew Caldwell
*Assistant Examiner* — Emily E Larocque
(74) *Attorney, Agent, or Firm* — Hewlett Packard Enterprise Patent Department

(57) ABSTRACT

Computer-implemented methods, systems, and devices to perform lossless compression of floating point format time-series data are disclosed. A first data value may be obtained in floating point format representative of an initial time-series parameter. For example, an output checkpoint of a computer simulation of a real-world event such as weather prediction or nuclear reaction simulation. A first predicted value may be determined representing the parameter at a first checkpoint time. A second data value may be obtained from the simulation. A prediction error may be calculated. Another predicted value may be generated for a next point in time and may be adjusted by the previously determined prediction error (e.g., to increase accuracy of the subsequent prediction). When a third data value is obtained, the adjusted prediction value may be used to generate a difference (e.g., XOR) for storing in a compressed data store to represent the third data value.

20 Claims, 8 Drawing Sheets

(58) Field of Classification Search
CPC .... H03M 7/60; H03M 7/6017; H03M 7/6047; H03M 7/6064–6094
USPC .................................................. 708/203, 204
See application file for complete search history.

(56) References Cited

OTHER PUBLICATIONS

C. Warrick et al., IBM TotalStorage DS6000 Series: Performance Monitoring and Tuning, redbooks, 2005 (Year: 2005).*
T. Mitsa, Temporal Data Mining, Chapman & Hall, 2010 (Year: 2010).*
A. Padyana, et al., Reducing the Disk IO Bandwidth Bottleneck through Fast Floating Point Compression using Accelerators, International Journal of Advanced Computer Research, vol. 4, No. 1, Issue 14, 2014 (Year: 2014).*
M. Burtscheretal., High Throughput Compression of Double-Precision Floating-Point Data, 2007 Data Compression Conference DCC'07, IEEE 2007 (Year: 2007).*
S. Li, Data Reduction Techniques for Scientific Visualization and Data Analysis, Dept of Computer and Information Science, University of Oregon, 2017 (Year: 2017).*
T. Pelkonen et al., Gorilla: A Fast, Scalable, In-Memory Time Series Database, Proceedings of the FLDB Endowment, vol. 8, No. 12, 2015 (Year: 2015).*
A. Padyana, et al., "Reducing the Disk IO Bandwidth Bottleneck through Fast Floating Point Compression using Accelerators," Mar. 2014, pp. 134-144.
Burtscher, M. et al.; "FPC: a High-speed Compressor for Double-precision Floating-point Data"; Jan. 1, 2009; 31 pages.
Ibtesham, D. et al.; "Comparing GPU and Increment-based Check-point Compression"; Nov. 1, 2012; 2 pages.
M. Burtscher et al., High Throughout Compression of Double-Precision Floating-Point Data, 2007 Data Compression Conference DCC'07, IEEE 2007 (Year: 2007).
Najmabadi, A. M. et al.; "Analyzing the Effect and Performance of Lossy Compression on Aeroacoustic Simulation of Gas injector"; May 12, 2017; 23 pages.
T. Pelkonen et al., Gorilla: A fast, Scalable, In-Memory Time Series Database, Proceedings of the FLDB Edownment, vol. 8, No. 12, 2015 (Year: 2015).
Tao, D. et al.; "Fixed-PSNR Lossy Compression for Scientific Data"; May 17, 2018; 5 pages.

* cited by examiner

FLOATING POINT DATA SET COMPRESSION

CROSS REFERENCE TO RELATED APPLICATION

This application is a continuation and claims the benefit of U.S. patent application Ser. No. 10/756,756, filed on Sep. 14, 2018, issued as U.S. Pat. No. 10,756756,909. The entire contents of the aforementioned application is incorporated herein by reference.

BACKGROUND

In the field of high performance computing (HPC) simulation, data sets of simulation result parameters evolve over time, and may be referred to as time-series data. These data sets may be periodically saved as "checkpoints," so that simulation can resume from the previously saved checkpoint, in case of interruptions induced by errors. Time-series data is usually multi-dimensional data that has a sequence of numbers where each value of a parameter may be collected at successive points in time (e.g., a value for each checkpoint). Based on the application generating the data (or the data collection technique), data can have multiple additional dimensions (in addition to time) that describe possible parameter values. Several types of applications may utilize time-series data. In particular, applications that simulate real world events such as weather, chemical reactions, aerodynamics, or flight simulations (and other types of simulations) may use time-series data checkpoints. A time-series storage may be implemented, in part, using a database optimized for storage and retrieval of time-series data. Because of the multiple dimensions that may be applicable to certain types of data (e.g., know data attributes), different types of time-series data may be stored in different ways to leverage these dimensions. For example, when simulating a weather event, temperature will not change dramatically over a period of seconds but in extreme conditions may change about 10 degrees Fahrenheit in a matter of minutes. Accordingly, the range of change of temperature over very short periods of time can be expected to be relatively constant. Temperature is just one example, because processes that are consistent with laws of nature exhibit attributes similar to that of temperature (e.g., gravity, atmospheric pressure, etc.) whereby they do not typically have sudden dramatic changes in properties over very short periods of time.

Some components associated with maintaining time-series data (e.g., in a time-series database) include: collection of data values (e.g., parameter values), checkpoints of data at periodic points in time, compression of data for storage, storage of compressed data, retrieval of compressed data, expansion of compressed data for analysis, and data analysis. Each of these components may be implemented on different servers in a distributed computing environment and different types of servers may be tuned to provide specialized performance for their function. For example, the type of computer storing large amounts of data may be a file server (e.g., optimized for storage), while the type of computer executing the simulation and generating the data may be a specialized high performance (with respect to compute resources) compute (HPC) cluster. Further, compression and decompression of checkpoints may be implemented on servers including substantial compute resources and high data throughput interfaces. In any case, different functions may be better matched with different types of computer systems so large scale time-series implementations may be distributed to handle potentially vast amounts of data associated with one or more simulations. Finally, to provide for storing vast amounts of data, different types of compression techniques may be used. Different data types (e.g., image data, integers, text, floating point) may have better compression results when using different types of compression. This disclosure addresses compression of floating point numbers associated with time-series data for use in either a single computer implementation or a distributed systems implementation.

BRIEF DESCRIPTION OF THE DRAWINGS

The present disclosure may be better understood from the following detailed description when read with the accompanying Figures. It is emphasized that, in accordance with standard practice in the industry, various features are not drawn to scale. In fact, the dimensions or locations of functional attributes may be relocated or combined based on design, security, performance, or other factors known in the art of computer systems. Further, order of processing may be altered for some functions, both internally and with respect to each other. That is, some functions may not require serial processing and therefore may be performed in an order different than shown or possibly in parallel with each other. For a detailed description of various examples, reference will now be made to the accompanying drawings, in which.

DETAILED DESCRIPTION

Figure 1:
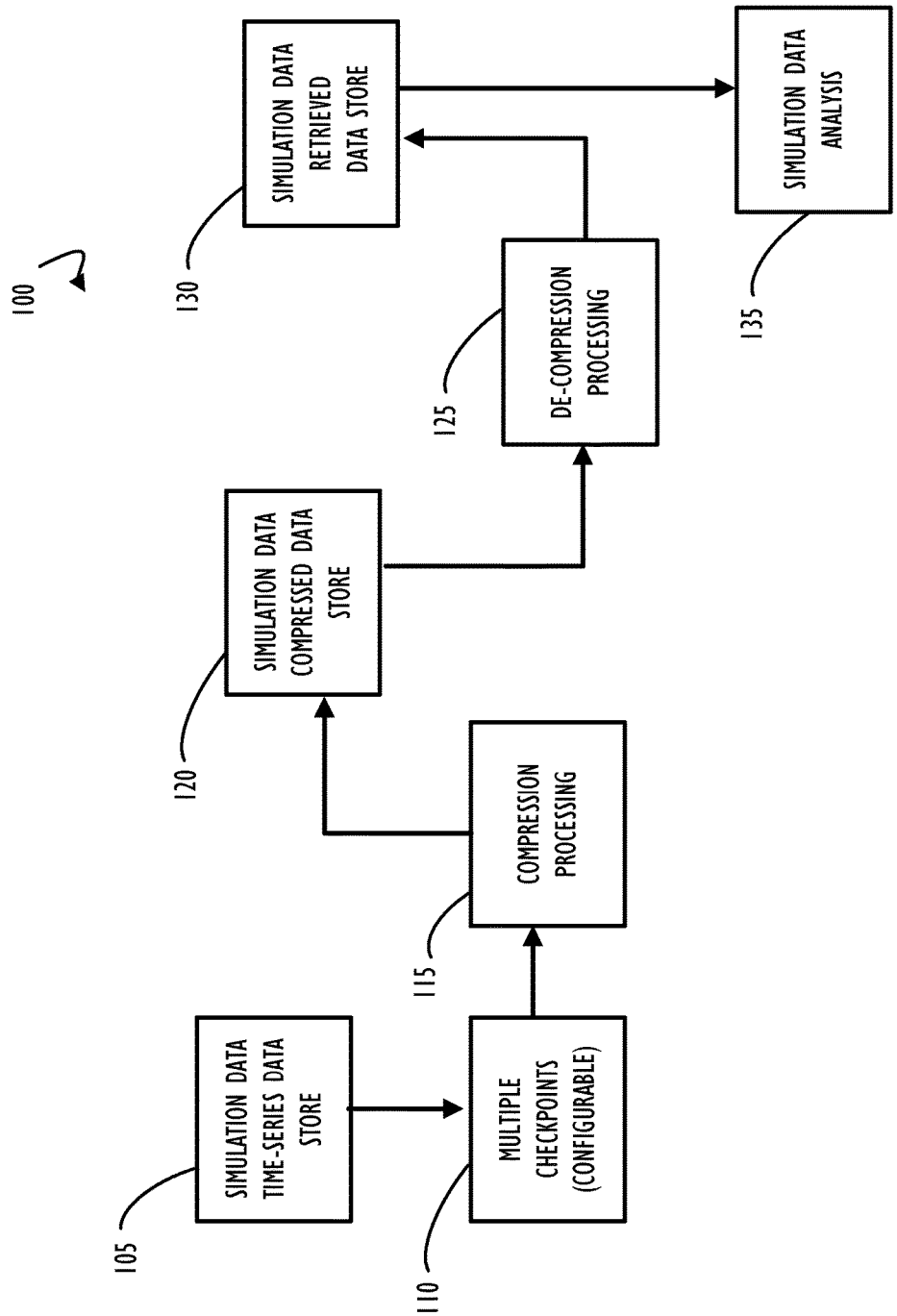
FIG. 1 is a block diagram representation of a sequence to obtain simulation data for a time-series data store; perform compression and storage; and retrieve data for analysis (e.g., re-create from a lossless compression technique), according to one or more disclosed implementations.

Examples of the subject matter claimed below will now be disclosed. In the interest of clarity, not all features of an actual implementation are described in this specification. It will be appreciated that in the development of any such actual example, numerous implementation-specific decisions may be made to achieve the developers specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Floating point numbers are a data format that is typically difficult to compress using standard dictionary based compression techniques, in part, because of how floating point numbers are stored in a computer system. Specifically, in one standard storage technique (IEEE 754), a double precision floating point number (e.g., floating point format) is stored in a computer system using 64 bits broken down into several parts, with 1 bit for sign, 11 bits for exponent, and 52 bits for mantissa. If the two floating point format numbers are relatively close in real value, then the sign, exponent, and first portion of the mantissa bits will be the same. Thus, techniques (such as FPC by Martin Burtscher) for compressing multiple related floating point numbers (e.g., time-series data) may store a difference (e.g., using a bitwise exclusive-or operation, or XOR) that allows the difference to be stored with a high compression ratio. To recreate the original data, each actual value may be retrieved by obtaining the original value and applying the difference (or series of deltas) to the base original value rather than storing each of the time-series values independently. Additionally, generated predicted values (where the generation process is repeatable) may be used to increase the similarity of subsequent measurements with actual values such that a difference between the predicted value and the actual value may be stored. Recreating the original data includes obtaining a base value and reversing the "re-creatable" steps used in compression and storage. Simply put, there may be a balance between processing requirements and overall storage capacity to achieve a desired throughput of data, for both compression and de-compression, based on different design criteria.

Checkpointing may represent one high overhead use case for input/output (IO) nodes in a high performance computing (HPC) cluster. Different compression techniques may be used to reduce this overhead. Compression techniques may be lossless where they maintain an exact value or lossy where only an approximation of the original value is maintained. In order for compression to be most beneficial in terms of overall system performance and memory requirement, a high compression ratio should be balanced with high throughput performance. Typically, a higher compression ratio results in lower throughput performance. Also, compression algorithms such as gzip, bzip, etc. may not be well suited for many HPC applications as these applications deal with floating point data with data patterns that are not generally amenable for normal entropy-based (such as Huffman) coding.

Compression algorithms for floating point (FP) data attempt to improve compression performance for compressing n-dimensional FP data grids by first decorrelating the data and then applying an encoding scheme. Generally, with this approach, data may be decorrelated by first predicting the data point and then taking the difference of the actual data point with the prediction. For certain applications, the prediction can be very close to the actual data point because some HPC applications dump data which are solutions to partial differential equations and exhibit spatial continuity. One example of a spatial correlation of floating point numbers may be a correlation of temperature measurements over some linear space, such that it is very likely that the temperature at points directly next to each other are closely related to temperature measured in the point to the left or right for that linear space. This spatial continuity may be exploited by using any of context-based predictors which maintain the context using a hash table, polynomial predictors which use polynomial approximation using adjacent points to the data point, or adaptive predictors which uses the predictor with highest compression for a block of numbers. Sometimes a combination of predictor types may be used.

Using predictors for compression may assist in the amount of compression achieved for data, in part, because the usually small difference between a prediction value and a real data point very likely has several leading zeros which can be encoded using Huffman coding, or fixed run-length coding for achieving high levels of compression. In general, context-based predictors present lesser compute demands and have higher throughput, as opposed to the adaptive approach which has higher compression ratios with lower throughput performance. The lower performance is caused, in part, because the adaptive approach needs to test different predictors.

Disclosed is a comprehensive floating point spatial-temporal compression technique that leverages both spatial and temporal information of data points to predict a floating point value. This technique differs from the context-based and adaptive techniques described above, in part, because a more accurate predictor (e.g., an offset predictor) value may be used. As a result, in the disclosed spatial-temporal compression technique the difference or XOR between the predicted and the actual value, will likely have more preceding zeros to enable attainment of an even higher compression ratio. This spatial-temporal compression technique thus represents an improvement in how a computer system works to achieve data compression over previously used techniques.

In one implementation of the disclosed spatial-temporal compression technique, three different versions of checkpoints (collected at three different points in time) may be utilized. The data values in each version add a spatial component to the prediction to provide a high compression ratio. In addition to spatial information, temporal continuity in checkpoints may be utilized, in part, by taking advantage of an earlier checkpoint to achieve both high compression ratio and throughput. As mentioned above, a checkpoint for FP compression schemes may store a difference, which is actually the prediction error (e.g., difference between actual value and predicted value). To increase accuracy of prediction and thus create more leading zeros in the prediction error (which leads to higher compression), the disclosed spatial-temporal technique may offset the error in prediction in subsequent checkpoints by adding the error in prediction of the first checkpoint to the prediction of the data points in the checkpoint being processed (See FIG. 3 and its discussion below). This technique may reduce the error and lead to further compression. Compression of subsequent checkpoints may also take advantage of an adaptive scheme. In this example implementation, the adaptive scheme refers to the case where the best predictor is already decided in the first prediction. When a best predictor is already available, subsequent checkpoints may use the same predictor and avoid computing the compression achieved by other predictors (See FIG. 5 and its discussion below). As should be clear, avoiding unnecessary computation may result in a saving of CPU cycles and processing overhead.

Having the above understanding of floating point format compression techniques, a detailed implementation example of improving predicted value accuracy and thus leading to higher compression ratios for certain types of data (e.g., time-series simulation data) is explained below with reference to the FIGS. Further, an example implementation for collection, compression, storage, transfer, retrieval (e.g., de-compression), and analysis is also explained. These example implementations may be implemented on a variety of different computer architectures. For example, the disclosed floating point collection and compression techniques may be implemented on a single computer system or a set of computer systems working together as a distributed computer system (including a cloud-based storage or compute resource portion) to recognize the benefits of this disclosure.

Referring now to FIG. 1, a block diagram representation illustrates a sequence to obtain simulation data for a time-series data store; perform compression and storage; and retrieve data for analysis (e.g., re-create from a lossless compression technique), according to one or more disclosed implementations. Block 105 indicates that simulation data may be collected as time-series data and stored in a time-series data store. As explained above, different types of data and data formats may benefit from different types of compression techniques. Disclosed implementations address using a spatial-temporal attribute of time-series data that may be typical in computer simulations of real-world events to store multiple checkpoints of floating point format data. Different numbers of checkpoints may be used to balance needs of random accessibility, storage space, and processing throughput. Block 110 indicates that a number of checkpoints used may be configurable. In general, the more checkpoints used may increase achievable compression but may also increase an amount of processing required to retrieve any individual data value. Thus, a tradeoff between accessibility and resources may be a design consideration when determining the number of checkpoints to maintain and utilize for data compression. Block 115 indicates that compression processing may use the multiple checkpoints to create simulation data to be stored in a compressed data store (block 120). Block 125 indicates that de-compression processing may extract information from the simulation data compressed data store and "re-create" the simulation data. Disclosed implementations may provide a lossless compression technique where actual data values from the simulation may be retrieved. Block 130 indicates that simulation data, once retrieved from a data store, may be provided (as indicated by block 135) for simulation analysis. As stated above, this simulation analysis function may occur on a computer system different from the computer system executing the simulation. Accordingly, having an intermediate compressed format (block 120) may reduce transfer time of simulation data from one computer system to another.

Figures 2A, 2B:
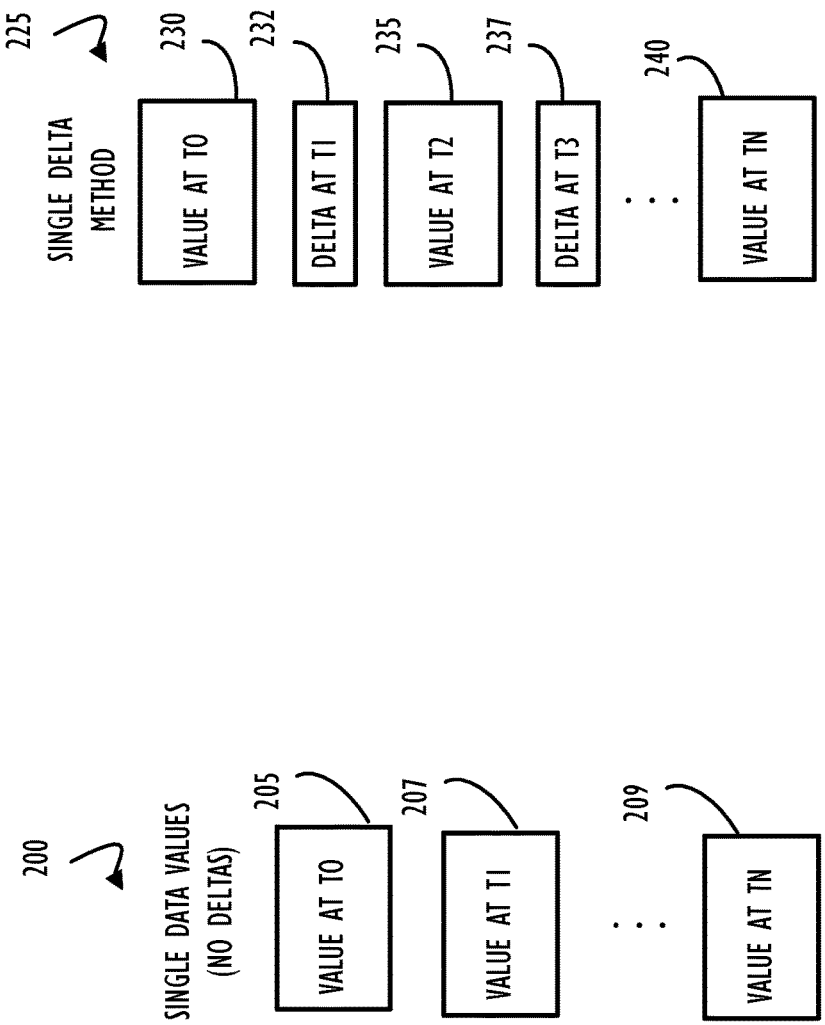
FIGS. 2A-B are block diagram representations of time-series compression techniques to explain different characteristics and techniques for compressing time-series data, according to one or more disclosed implementations.

FIGS. 2A-B are block diagram representations of time-series compression techniques to explain different characteristics and techniques for compressing time-series data, according to one or more disclosed implementations. FIG. 2A illustrates a single data value compression technique 200 that may be used (e.g., with no deltas) to store each value independently of each other. An implementation of this type would allow retrieval of any individual data value without requiring re-creation (or calculation) of any preceding or subsequent values. Specifically, a value at time T0 205 would be individually compressed, followed by a compression of a value at time T1 207, and repeated for subsequent values up to and including a value at time TN 209. In this type of implementation, compression ratios may be limited to the degree of compression for original values and their data type. This type of implementation may decrease access time to additional values but would likely incur a cost of higher storage space requirements (because compression ratios are likely to be relatively low as compared to other techniques).

FIG. 2B illustrates a single delta method compression technique 225 where a single delta may be used between each actual data value. That is, a complete data value at time T0 230 may be compressed from its original format and time T1 232 may be represented as a delta. The data value at time T2 235 may again be stored as a complete data value and T3 237 may be stored as a delta. This process may be repeated until time TN 240. In order to retrieve a value that was stored as a delta, the data value at the immediately preceding time would need to be decompressed and then application of the delta to that value would provide the desired simulation data value. In this implementation, storage space requirements may be reduced over the single value compression technique 200 but will increase processing requirements for access to any data value that is stored as a delta (e.g., T1 232 and T3 237), in part, because the previous value will have to be decoded, the delta will have to be decoded, and then the delta will have to be applied to the previous value.

Figure 3:
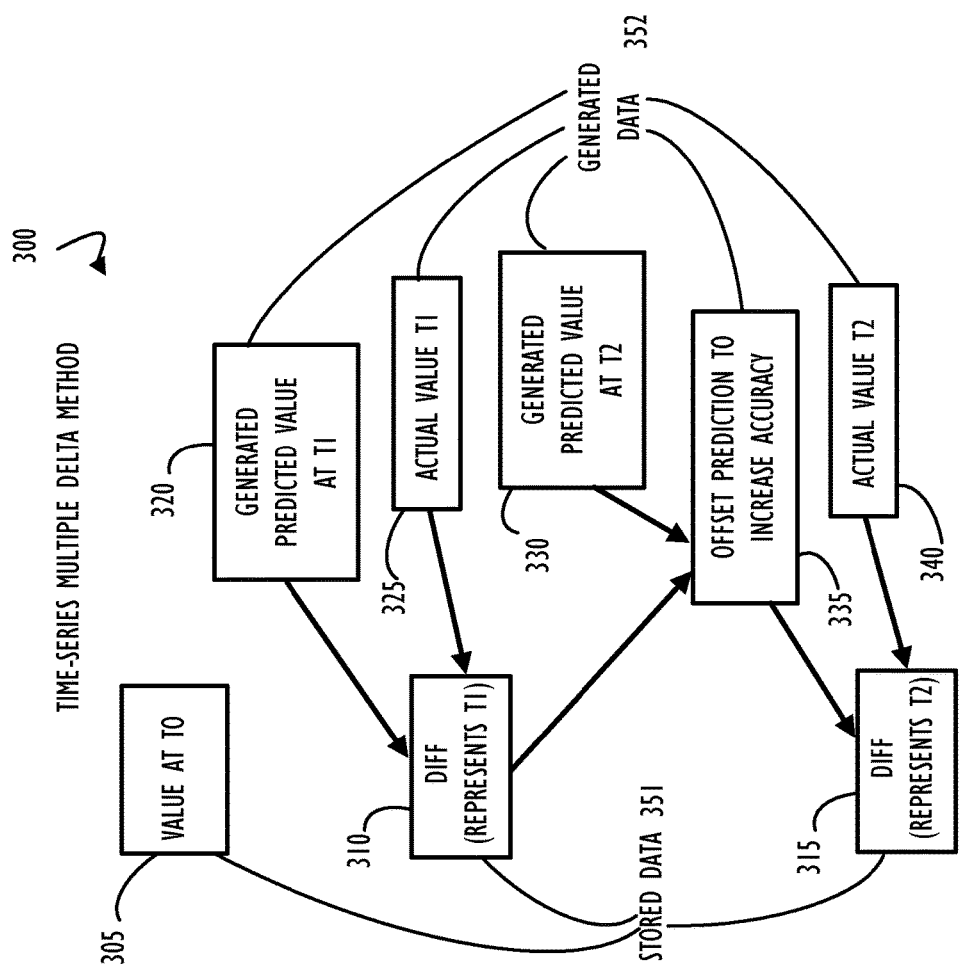
FIG. 3 is a block diagram representing a time-series data compression technique utilizing multiple deltas and data prediction using an offset prediction adjustment technique to potentially increase prediction accuracy, according to one or more disclosed implementations.

FIG. 3 is a block diagram representing a time-series multiple delta data compression technique 300 utilizing multiple deltas and data prediction using an offset prediction adjustment to potentially increase prediction accuracy, according to one or more disclosed implementations. As stated above, as prediction accuracy increases, the amount of storage for a delta off that prediction decreases, in part, because the delta may have additional leading zeros that are amenable to compression. Beginning at block 305 a value at time T0 is obtained, for example, from a computer simulation as discussed above. A value may then be generated as a predicted value for the corresponding data value (e.g., the same simulation parameter) at time T1. The value may be generated using a re-creatable algorithm (block 320) such that the predicted value may not need to be stored as part of the compressed data store and may be regenerated at decompression time. The actual value from the simulation may be obtained as indicated at block 325. Block 310 indicates that a difference (e.g., XOR) of the generated predicted value at time T1 320 and the actual value at time T1 325 may represent a data value that is stored (rather than calculated) in a compressed data store. As the simulation progresses to time T2, Block 330 indicates that a second generated predicted value (e.g., at time T2) may be calculated. Block 335 indicates that this second generated predicted value may be offset (e.g., adjusted) by the difference of the previous prediction (e.g., prediction error) to increase the accuracy of the prediction value. Block 315 indicates that a difference (e.g., XOR) of the offset prediction value (335) and the actual value obtained at time T2 (block 340) may be stored to represent the actual value at time T2 in compressed format in a compressed data store.

Figure 4:
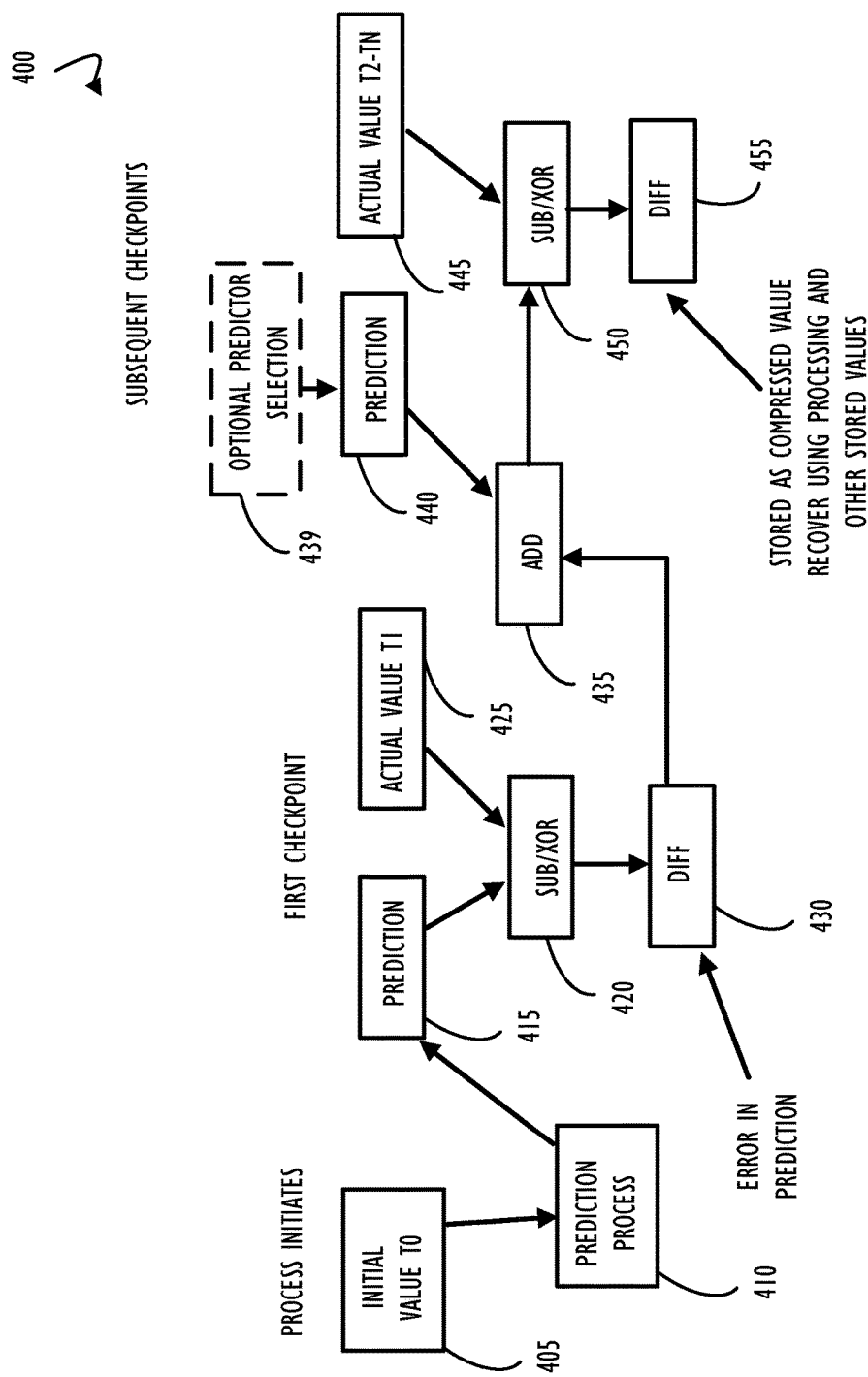
FIG. 4 is a block diagram flow representation of a technique to offset prediction values across checkpoints, according to one or more disclosed implementations.

In the time-series multiple delta data compression technique 300 of FIG. 3, data values representing stored data 351 include: value at T0 305, diff for T1 310, and diff for T2 315. Other data values may be generated, in part, from these three values at time of de-compression and are represented by generated data 352. The generated data does not need to be stored in a compressed data store representation of the time-series data. However, in some embodiments (at a cost of storage area and compression ratio) some of these data elements may be stored to possibly increase retrieval throughput for data decompression. Also note, that to retrieve the value at T2 (e.g., that in block 340) it would be necessary to retrieve the value at time T0, each of the predicted values for times T1 and T2 would need to be generated and the diffs represented by diff for T1 310 and diff for T2 315 would need to be arithmetically applied, FIG. 4 is a block diagram 400 flow representation of a technique to offset prediction values across checkpoints, according to one or more disclosed implementations. Block 405 indicates that the process initiates with an initial value at time T0. Block 410 indicates that a prediction process may be executed to create a first predicted value (e.g., a prediction of the value at time T1 for the first checkpoint). The prediction process may include selection of a predictor from a plurality of possible predictors and using the selected predictor (e.g., most accurate) to create the first predicted value. Block 425 indicates that the actual value at time T1 may be obtained. Block 420 indicates that a difference (subtraction or XOR) may be performed between the prediction value 415 and the actual value 425 to create difference value 430. The value at block 430 represents a difference value that may be stored as part of a compressed data store and also represents an error in the first prediction. For subsequent checkpoints (e.g., after the first checkpoint), block 440 indicates a prediction value (that may be generated using a prediction process like that of block 410 and optionally include predictor selection 439) for a future point in time (e.g., a point in time associated with a checkpoint for T2 through TN). Block 435 indicates that the prediction value may be refined by adding (or offsetting) the prediction value by a previous error in prediction (e.g., as shown at block 430). Next the offset prediction value may be processed with the actual value for a corresponding checkpoint (e.g., at T2 through TN) as indicated at block 450. This processing may again be subtraction or XOR to create another diff value (shown at block 455). These diff values may be stored as a compressed value as part of a compressed data store and original values (e.g., decompressed data) may be obtained using processing and the minimally required difference data maintained as discussed above.

Figure 5:
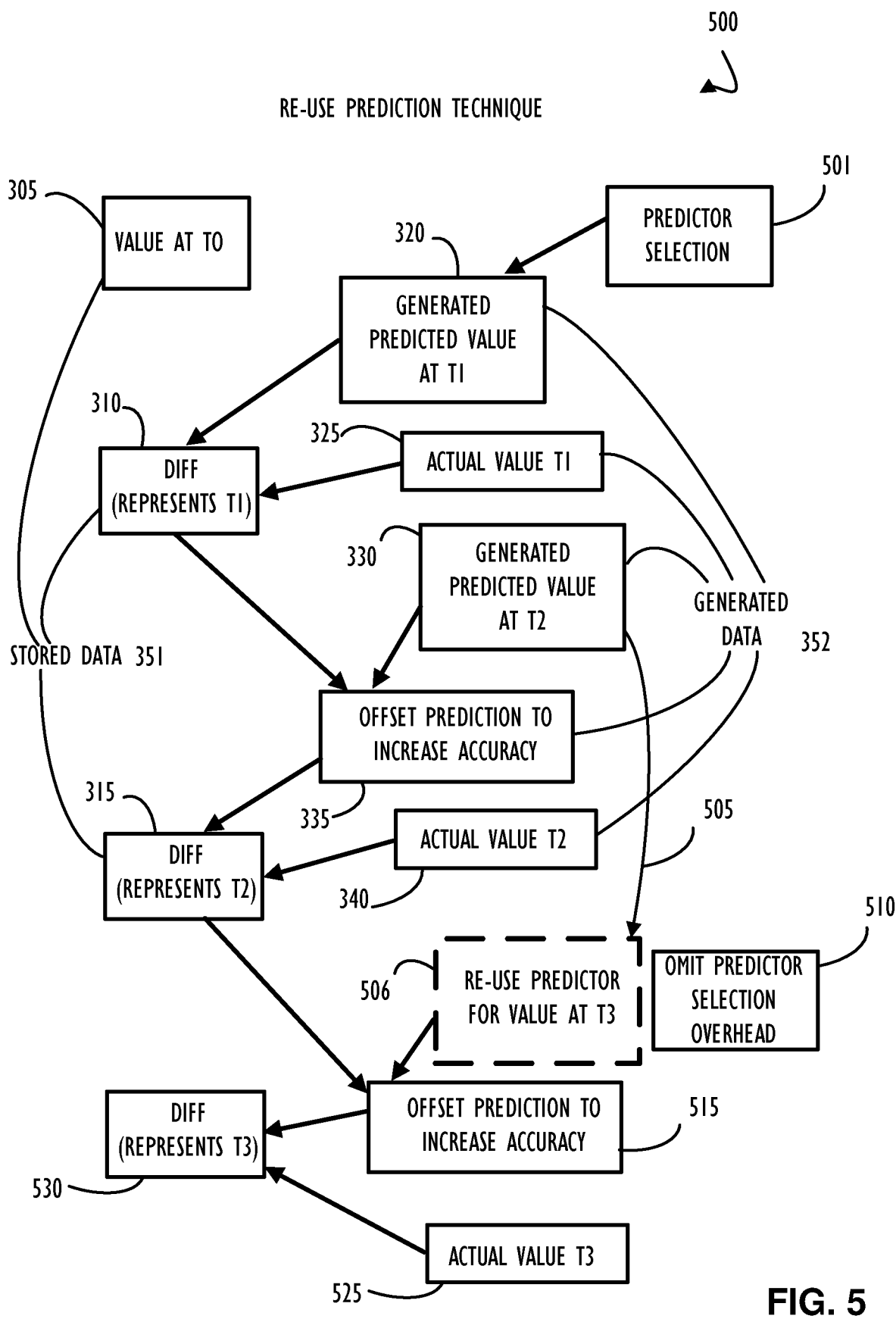
FIG. 5 is a block diagram representation illustrating a possible reduction in processing overhead for the techniques of delta offsetting and prediction as illustrated in FIGS. 3 and 4, according to one or more disclosed implementations.

FIG. 5 is a block diagram 500 representation illustrating a possible reduction in processing overhead for the techniques of delta offsetting and prediction as illustrated in FIGS. 3 and 4, according to one or more disclosed implementations. As mentioned above, different parts of processing may be altered to produce slightly different compression techniques with an overall goal of reducing processing time at compression, de-compression, or both. In some implementations, multiple prediction techniques (e.g., predictors) may be run in parallel to determine which predictor produces a best prediction. This selection process may use compute resources that may be omitted in certain disclosed implementations (as illustrated in FIG. 5). To conserve overhead, a "best" predictor may be selected (e.g., by predictor selection block 510) and re-used for a configurable number of times prior to repeating the predictor selection overhead. In one example implementation, a previously saved prediction error may be augmented (e.g., add state metadata) to indicate the predictor used. Reductions in processing time will generally increase throughput of both the compression processing and subsequent decompression processing. In block diagram 500, the flow illustrated in FIG. 3 has been extended to illustrate re-use of a prediction technique for a next predicted value (e.g., to omit prediction technique selection overhead as illustrated by block 510). In this example, arrow 505 illustrates that the prediction technique used to obtain prediction value at time T2 330 may be used again for subsequent times (e.g., T3 is illustrated at block 506) if it was deemed an acceptable prediction technique (e.g., it was an accurate prediction and the difference determined as prediction error was low). In this example, the generated predicted value at time T3 (506) may be offset by the prediction difference at T2 315 to obtain an offset predicted value for T3 as illustrated by block 515. The actual value at time T3 may be obtained (block 525) and the difference between the actual value at time T3 525 and offset predicted value 515 may be stored as a diff to represent T3 (block 530). This difference may be used as a data value in a compressed data storage representation of time T3 and processing for selecting a prediction technique for the predicted value at time T3 has been eliminated.

Figure 6:
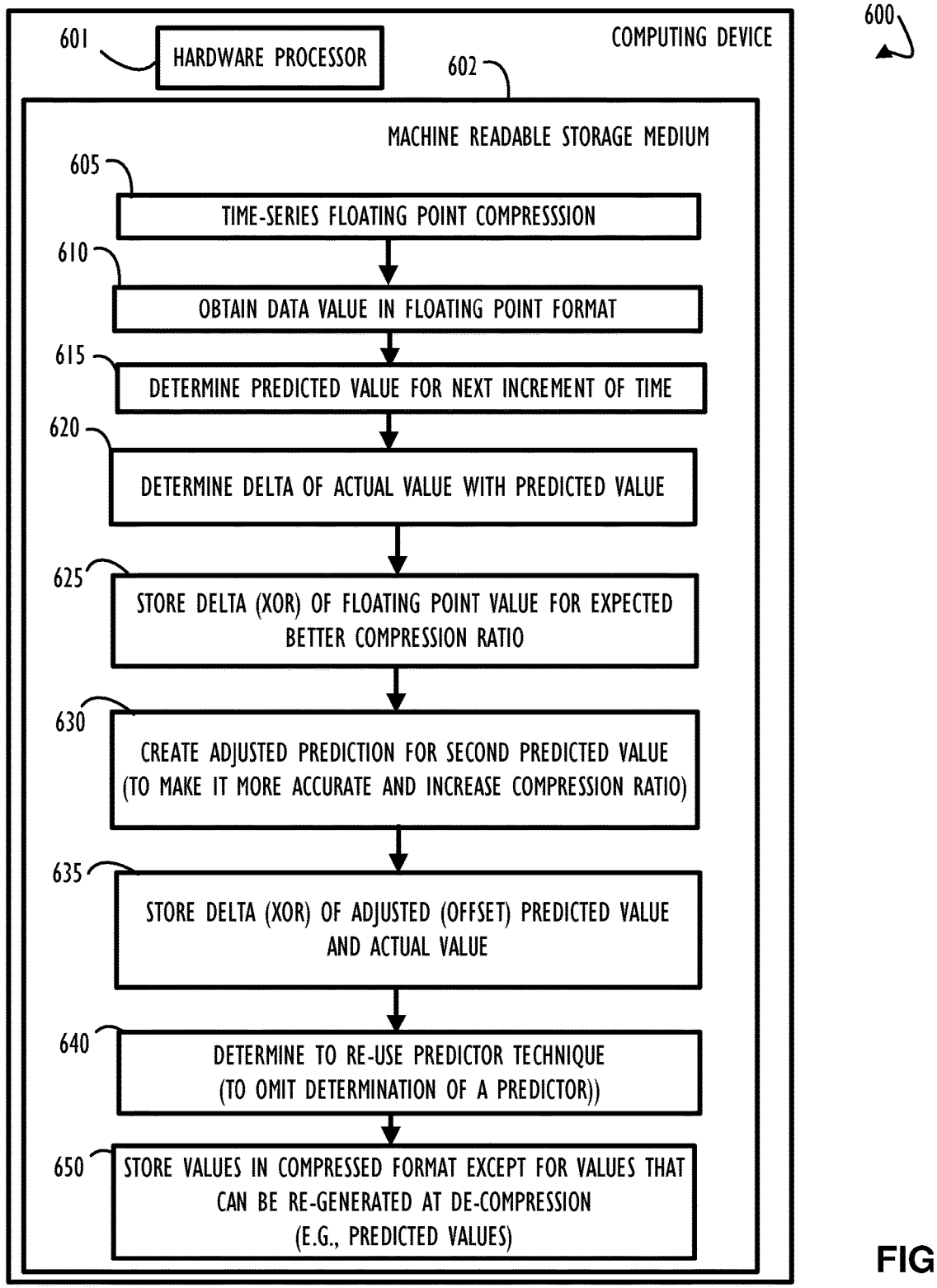
FIG. 6 is a block diagram representing a computing device implementing a technique to collect and compress time-series floating point data, according to one or more disclosed implementations.

FIG. 6 is a block diagram representing a computing device implementing a technique to collect and compress time-series floating point data, according to one or more disclosed implementations. Computing device 600 includes at least one hardware processor 601 and a machine readable storage medium 602. As illustrated, machine readable medium 602 may store instructions, that when executed by hardware processor 601 (either directly or via emulation/virtualization), cause hardware processor 601 to perform one or more disclosed techniques to obtain and compress time-series data in floating point format. In this example, the instructions stored reflect a method similar to one of the techniques discussed with respect to FIGS. 3-5 above.

Beginning at block 605, the stored instruction may be directed a floating point delta compression technique for time-series data. Block 610 indicates that the instructions may direct hardware processor 601 to obtain data in floating point format (e.g., from a simulation). Block 615 indicates that instructions may be executed on hardware processor 601 to generate a predicted value for a next increment in time (e.g., subsequent checkpoint). Block 620 indicates that instructions may determine a delta of an actual obtained value with a predicted value. Block 625 indicates that the delta may be generated using an exclusive OR (XOR) function to produce a higher compression ratio for floating point format data as opposed to compressing each individual floating point format number. Block 630 indicates that a second generated predicted value may be further adjusted to make it more accurate and increase compression ratio, in part, because the delta from the adjusted predicted value would be less than a delta from the predicted value (prior to adjustment). Block 635 indicates that the delta (from the offset predicted value and the actual value) may be stored in a compressed data store. Thus, it is not required to store either the predicted value or the actual value because those may be regenerated as part of a decompression process. Block 640 indicates that a selected predictor may be re-used for a subsequent checkpoint rather than performing the overhead of selecting a predictor when generating a new predicted value. For example, if the previously used predictor was determined acceptable for re-use. This may omit processing and increase throughput. Block 650 indicates that only delta values and an initial value for certain checkpoints are required to be stored in a compressed data store representation of the original time-series data because other values may be regenerated as necessary for decompression of the complete time-series data sequence.

Figure 7:
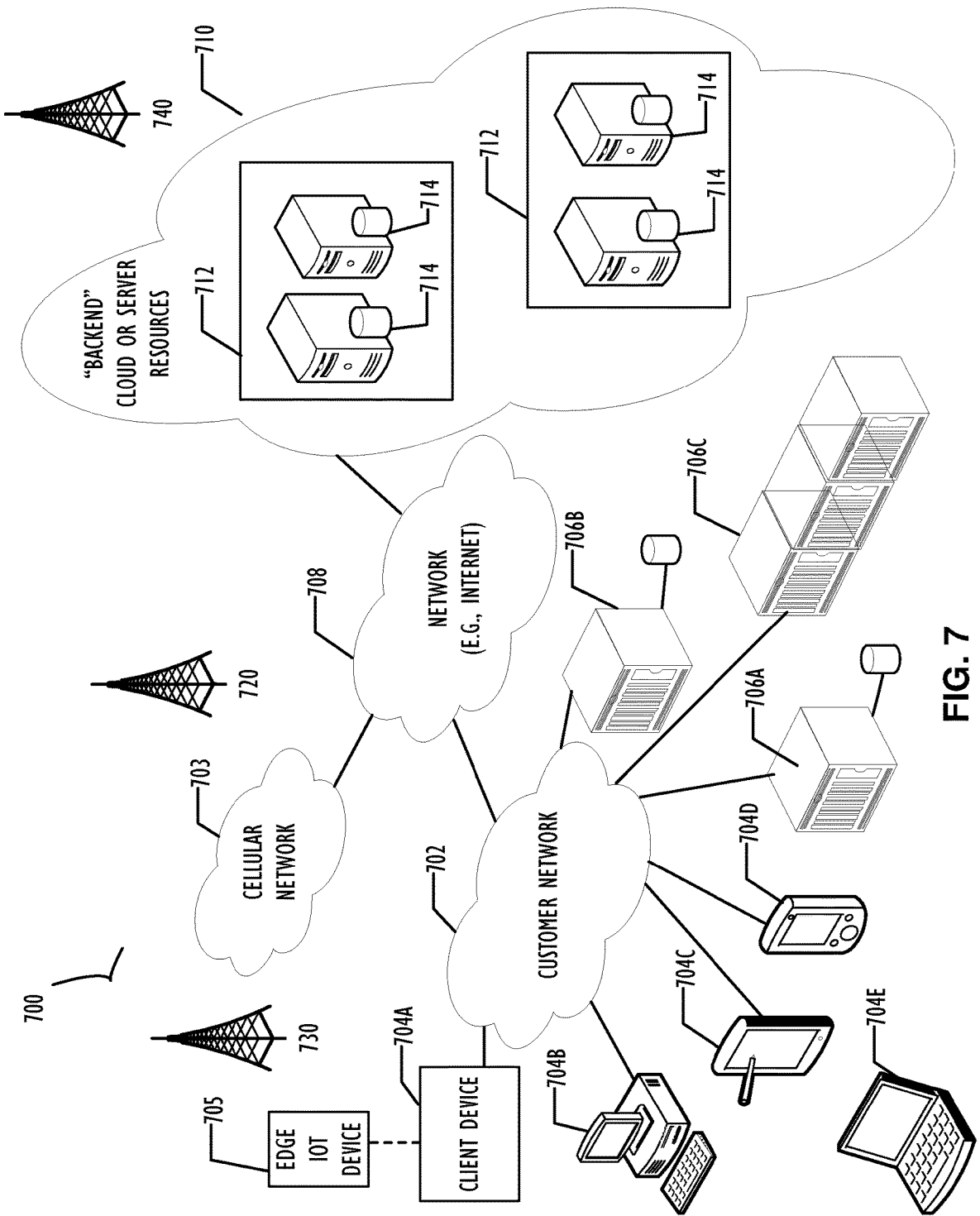
FIG. 7 represents a computer network infrastructure that may be used to implement all or part of the disclosed simulation, collection, compression, retrieval and analysis of time-series floating point data, according to one or more disclosed implementations.

FIG. 7 represents a computer network infrastructure that may be used to implement all or part of the disclosed simulation, collection, compression, retrieval and analysis of time-series floating point data, according to one or more disclosed implementations. As discussed above, disclosed techniques for simulation and compression of floating point format time-series data may be used in a distributed system, such as network infrastructure 700, to improve overall throughput and storage of time-series simulation data and its subsequent analysis. Network infrastructure 700 includes a set of networks where implementations of the present disclosure may operate, including the disclosed floating point data format compression techniques. For example, there may be multiple servers supporting data storage implemented within hardware clusters that have nodes at different locations (e.g., data centers) and those data centers may communicate with each other through network infrastructure 700. Network infrastructure 700 comprises a customer network 702, network 708, cellular network 703, and a cloud service provider network 710. Any of these networks may have nodes providing or receiving simulation data in accordance with this disclosure. That is, each of these different networks may include one or more computer devices that implement one or more steps in the disclosed techniques for compression/decompression of simulation data. In one implementation, the customer network 702 may be a local private network, such as local area network (LAN) that includes a variety of network devices that include, but are not limited to switches, servers, and routers.

Each of these networks can contain wired or wireless programmable devices and operate using any number of network protocols (e.g., TCP/IP) and connection technologies (e.g., WiFi® networks, or Bluetooth®. In another implementation, customer network 702 represents an enterprise network that could include or be communicatively coupled to one or more local area networks (LANs), virtual networks, data centers and/or other remote networks (e.g., 708, 710). In the context of the present disclosure, customer network 702 may include one or more high-availability data stores (e.g., quorum data store), switches, or network devices using methods and techniques such as those described above.

As shown in FIG. 7, customer network 702 may be connected to one or more client devices 704A-E and allow the client devices 704A-E to communicate with each other and/or with cloud service provider network 710, via network 708 (e.g., Internet). Client devices 704A-E may be computing systems such as desktop computer 704B, tablet computer 704C, mobile phone 704D, laptop computer (shown as wireless) 704E, and/or other types of computing systems generically shown as client device 704A. In this context, client devices should not be confused with a client application of a server-based application (or distributed application) because they represent devices in a client-server architecture rather than applications. However, while it is true that client devices may often run client applications, there are situations where a client device will execute the server side of a client-server application such that the client device communicates with a server device (e.g., executing the client application) to request remote execution on behalf of the client device. That is, the client device may execute a server application portion with the server device executing the client application portion for a given client-server application architecture. In general, the client portion of an application is the portion that requests some work and receives the results of the work, with the server portion receiving the request for work, performing that work, and providing the results.

Network infrastructure 700 may also include other types of devices generally referred to as Internet of Things (IoT) (e.g., edge IOT device 705) that may be configured to send and receive information via a network to access cloud computing services or interact with a remote web browser application (e.g., to receive configuration information).

FIG. 7 also illustrates that customer network 702 includes local compute resources 706A-C that may include a server (e.g., a data storage server for a SAN), access point, router, or other device configured to provide for local computational resources and/or facilitate communication amongst networks and devices. For example, local compute resources 706A-C may be one or more physical local hardware devices to support a compression/decompression of time-series data as outlined above. Local compute resources 706A-C may also facilitate communication between other external applications, data sources (e.g., 707A and 707B), and services, and customer network 702.

Network infrastructure 700 also includes cellular network 703 for use with mobile communication devices. Mobile cellular networks support mobile phones and many other types of mobile devices such as laptops etc. Mobile devices in network infrastructure 700 are illustrated as mobile phone 704D, laptop computer 704E, and tablet computer 704C. A mobile device such as mobile phone 704D may interact with one or more mobile provider networks as the mobile device moves, typically interacting with a plurality of mobile network towers 720, 730, and 740 for connecting to the cellular network 703. Because of the distributed nature of SAN, the disclosed implementations may be distributed over large geographic areas to support delivery of data to cellular devices.

FIG. 7 illustrates that customer network 702 is coupled to a network 708. Network 708 may include one or more computing networks available today, such as other LANs, wide area networks (WAN), the Internet, and/or other remote networks, in order to transfer data between client devices 704A-D and cloud service provider network 710. Each of the computing networks within network 708 may contain wired and/or wireless programmable devices that operate in the electrical and/or optical domain.

In FIG. 7, cloud service provider network 710 is illustrated as a remote network (e.g., a cloud network) that is able to communicate with client devices 704A-E via customer network 702 and network 708. The cloud service provider network 710 acts as a platform that provides additional computing resources to the client devices 704A-E and/or customer network 702. In one implementation, cloud service provider network 710 includes one or more data centers 712 with one or more server instances 714. Cloud service provider network 710 may also include one or more frames or clusters (and cluster groups) representing a scalable compute resource that may benefit from the techniques of this disclosure. Also, cloud service providers typically require near perfect uptime availability and may use the disclosed techniques, methods, and systems to provide that level of service.

Figure 8:
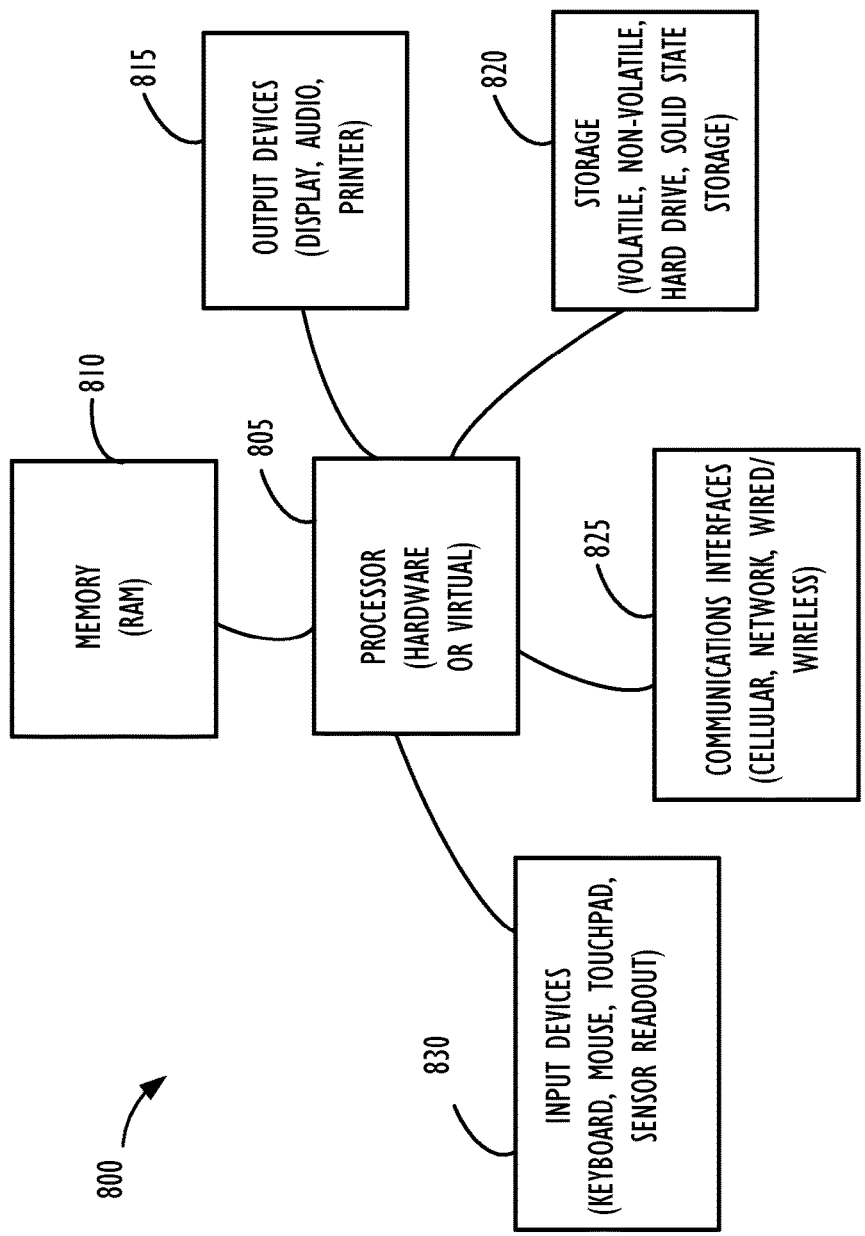
FIG. 8 illustrates a computer processing device that may be used to implement the functions, modules, processing platforms, execution platforms, communication devices, and other methods and processes of this disclosure.

FIG. 8 illustrates a computing device 800 that may be used to implement or be used with the functions, modules, processing platforms, execution platforms, communication devices, and other methods and processes of this disclosure. For example, computing device 800 illustrated in FIG. 8 could represent a client device or a physical server device as illustrated in any of FIGS. 1 through 7. Each device may include either hardware or virtual processor(s) depending on the level of abstraction of the computing device. Specifically, each of the storage servers, application servers, network devices, and other processing devices discussed above may be considered instances of a computing device similar to computing device 800. Accordingly, multiple instances of computing device 800 and processor 805 may be used to implement the above disclosed methods and systems for simulation and checkpointing of floating point time-series data. In some instances (without abstraction), computing device 800 and its elements, as shown in FIG. 8, each relate to physical hardware. Alternatively, in some instances one, more, or all of the elements could be implemented using emulators or virtual machines as levels of abstraction. In any case, no matter how many levels of abstraction away from the physical hardware, computing device 800 at its lowest level may be implemented on physical hardware.

As also shown in FIG. 8, computing device 800 may include one or more input devices 830, such as a keyboard, mouse, touchpad, or sensor readout (e.g., biometric scanner) and one or more output devices 815, such as displays, speakers for audio, or printers. Some devices may be configured as input/output devices also (e.g., a network interface or touchscreen display).

Computing device 800 may also include communications interfaces 825, such as a network communication unit that could include a wired communication component and/or a wireless communications component, which may be communicatively coupled to processor 805. The network communication unit may utilize any of a variety of proprietary or standardized network protocols, such as Ethernet, TCP/IP, to name a few of many protocols, to effect communications between devices. Network communication units may also comprise one or more transceiver(s) that utilize the Ethernet, power line communication (PLC), WiFi, cellular, and/or other communication methods.

As illustrated in FIG. 8, computing device 800 includes a processing element such as processor 805 that contains one or more hardware processors, where each hardware processor may have a single or multiple processor core. In one implementation, the processor 805 may include at least one shared cache that stores data (e.g., computing instructions) that are utilized by one or more other components of processor 805. For example, the shared cache may be a locally cached data stored in a memory for faster access by components of the processing elements that make up processor 805. In one or more implementations, the shared cache may include one or more mid-level caches, such as level 2 (L2), level 3 (L3), level 4 (L4), or other levels of cache, a last level cache (LLC), or combinations thereof. Examples of processors include but are not limited to a central processing unit (CPU) and a microprocessor. Although not illustrated in FIG. 8, the processing elements that make up processor 805 may also include one or more of other types of hardware processing components, such as graphics processing units (GPU), application specific integrated circuits (ASICs), field-programmable gate arrays (FPGAs), and/or digital signal processors (DSPs).

FIG. 8 illustrates that memory 810 may be operatively and communicatively coupled to processor 805. Memory 810 may be a non-transitory medium configured to store various types of data. For example, memory 810 may include one or more storage devices 820 that comprise a non-volatile storage device and/or volatile memory. Volatile memory, such as random-access memory (RAM), can be any suitable non-permanent storage device. The non-volatile storage devices 820 can include one or more disk drives, optical drives, solid-state drives (SSDs), tap drives, flash memory, read only memory (ROM), and/or any other type of memory designed to maintain data for a duration of time after a power loss or shut down operation. In certain instances, the non-volatile storage devices 820 may be used to store overflow data if allocated RAM is not large enough to hold all working data. The non-volatile storage devices 820 may also be used to store programs that are loaded into the RAM when such programs are selected for execution.

Persons of ordinary skill in the art are aware that software programs may be developed, encoded, and compiled in a variety of computing languages for a variety of software platforms and/or operating systems and subsequently loaded and executed by processor 805. In one implementation, the compiling process of the software program may transform program code written in a programming language to another computer language such that the processor 805 is able to execute the programming code. For example, the compiling process of the software program may generate an executable program that provides encoded instructions (e.g., machine code instructions) for processor 805 to accomplish specific, non-generic, particular computing functions.

After the compiling process, the encoded instructions may then be loaded as computer executable instructions or process steps to processor 805 from storage device 820, from memory 810, and/or embedded within processor 805 (e.g., via a cache or on-board ROM). Processor 805 may be configured to execute the stored instructions or process steps in order to perform instructions or process steps to transform the computing device into a non-generic, particular, specially programmed machine or apparatus. Stored data, e.g., data stored by a storage device 820, may be accessed by processor 805 during the execution of computer executable instructions or process steps to instruct one or more components within the computing device 800.

A user interface (e.g., output devices 815 and input devices 830) can include a display, positional input device (such as a mouse, touchpad, touchscreen, or the like), keyboard, or other forms of user input and output devices. The user interface components may be communicatively coupled to processor 805. When the output device is or includes a display, the display can be implemented in various ways, including by a liquid crystal display (LCD) or a cathode-ray tube (CRT) or light emitting diode (LED) display, such as an organic light emitting diode (OLED) display. Persons of ordinary skill in the art are aware that the computing device 800 may comprise other components well known in the art, such as sensors, powers sources, and/or analog-to-digital converters, not explicitly shown in FIG. 8.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. A computer-implemented method comprising:
   obtaining a first data value at a first time T0 representative of a parameter maintained over time within a computer system;
   generating a first predicted value for the parameter at a time T1 after time T0;
   obtaining an actual data value for the parameter at the first point in time;
   storing a first floating point prediction error, the first floating point prediction error based on a difference between the first predicted value and the second data value;
   determining a second predicted value for the parameter at a time T2 after time T1;
   obtaining a third data value of the parameter at time T2;
   creating an offset second predicted value by adjusting the second predicted value by the first floating point prediction error;
   storing a second floating point prediction error, the second floating point prediction error based on a difference between the offset second predicted value and the third data value;
   utilizing the first floating point prediction error and the second floating point prediction error to create a lossless compressed representation of the second data value and the third data value; and
   transmitting the lossless compressed representation as a portion of a checkpoint associated with a simulation generating the first data value, the second data value, and the third data value.

2. The computer-implemented method of claim 1, wherein the lossless compressed representation is sufficient to recreate the second data value and the third data value at their original accuracy.

3. The computer-implemented method of claim 1, wherein the lossless compressed representation utilizes less computer storage than storing corresponding actual data values.

4. The computer-implemented method of claim 1, further comprising:
   storing the lossless compressed representation.

5. The computer-implemented method of claim 4, wherein the lossless compressed representation is transmitted for storage on a computer device remotely connected to a computer system executing the simulation.

6. The computer-implemented method of claim 1, further comprising:
   determining a third predicted value for the parameter at a time T3 after time T2;
   obtaining a fourth data value representative of the parameter at the third point in time;
   creating an offset third predicted value by adjusting the third predicted value by the second floating point prediction error;
   storing a third floating point prediction error, the third floating point prediction error based on a difference between the offset third predicted value and the fourth data value; and
   utilizing the second floating point prediction error and the third floating point prediction error to create a lossless compressed representation of the third data value and the fourth data value.

7. The computer-implemented method of claim 1, further comprising:
   identifying a prediction technique used to generate the second predicted value as acceptable for continued use;
   using the prediction technique to generate a third predicted value;
   obtaining a fourth data value representative of the parameter time T3;
   creating an offset third predicted value by adjusting the third predicted value by the second floating point prediction error;
   storing a third floating point prediction error based on a difference between the offset third predicted value and the fourth data value; and
   utilizing the second floating point prediction error and the third floating point prediction error to create a lossless compressed representation of the third data value and the fourth data value.

8. The computer-implemented method of claim 7, wherein identifying the prediction technique used to generate the second predicted value as acceptable for continued use comprises omitting determination of a technique to generate the third predicted value.

9. A computer device, comprising:
   a hardware processor;
   a persistent memory storage area communicatively coupled to the hardware processor; and
   an instruction memory area communicatively coupled to the hardware processor, wherein the instruction memory area stores instructions, that when executed by the hardware processor, cause the hardware processor to:
   obtain a first data value representative of a parameter maintained over time within a computer system;
   determine a first predicted value for the parameter at a first point in time;
   store a difference between the first predicted value and the first data value;
   obtain a second data value representative of the parameter at the first point in time;
   determine a first floating point prediction error based on a difference between the first predicted value and the second data value;
   determine a second predicted value for the parameter at a second point in time after the first point in time;
   obtain a third data value representative of the parameter at the second point in time;
   create an offset second predicted value by adjusting the second predicted value by the first floating point prediction error;
   store a second floating point prediction error based on a difference between the offset second predicted value and the third data value;
   utilize the first floating point prediction error and the second floating point prediction error to create a lossless compressed representation of the second data value and the third data value; and
   store the lossless compressed representation as a portion of a checkpoint associated with a simulation generating the first data value, the second data value, and the third data value.

10. The computer device of claim 9, wherein the lossless compressed representation is sufficient to recreate the second data value and the third data value at their original accuracy.

11. The computer device of claim 9, wherein the lossless compressed representation utilizes less computer storage than storing corresponding actual data values.

12. The computer device of claim 9, wherein the instruction memory area further comprises instructions, that when executed by the hardware processor, cause the hardware processor to:
transmit the lossless compressed representation to a remote computer system.

13. A non-transitory computer readable medium comprising computer executable instructions stored thereon that when executed by one or more hardware processors, cause the one or more hardware processors to:
obtain a first data value as a floating point number representative of a parameter maintained over time within a computer system;
determine a first predicted value in floating point format for the parameter representing the parameter at a first point in time after an initial point in time associated with the first data value;
obtain a second data value representative of the parameter at the first point in time;
calculate a first floating point prediction error based on a difference between the first predicted value and the second data value;
determine a second predicted value in floating point format for the parameter representing the parameter at a second point in time after the first point in time;
obtain a third data value representative of the parameter at the second point in time;
create an offset second predicted value by adjusting the second predicted value by the first floating point prediction error;
calculate a second floating point prediction error based on a difference between the offset second predicted value and the third data value;
utilize the first floating point prediction error and the second floating point prediction error to create a lossless compressed representation of the second data value and the third data value; and
store the lossless compressed representation as a portion of a checkpoint associated with a simulation generating the first data value, the second data value, and the third data value.

14. The non-transitory computer readable medium of claim 13, wherein the lossless compressed representation is sufficient to recreate the second data value and the third data value at their original accuracy.

15. The non-transitory computer readable medium of claim 13, wherein the lossless compressed representation utilizes less computer storage than storing corresponding actual data values.

16. The non-transitory computer readable medium of claim 13, wherein the instructions further comprise instructions, that when executed by the one or more hardware processors, cause the one or more hardware processors to:
transmit the lossless compressed representation to a remote computer system.

17. The non-transitory computer readable medium of claim 16, wherein the lossless compressed representation transmission utilizes less transmission bandwidth than transmitting corresponding actual data values.

18. The non-transitory computer readable medium of claim 13, wherein the instructions further comprise instructions, that when executed by the one or more hardware processors, cause the one or more hardware processors to:
determine a third predicted value in floating point format for the parameter representing the parameter at a third point in time after the second point in time;
obtain a fourth data value representative of the parameter at the third point in time;
create an offset third predicted value by adjusting the third predicted value by the second floating point prediction error;
calculate a third floating point prediction error based on a difference between the offset third predicted value and the fourth data value; and
utilize the second floating point prediction error and the third floating point prediction error to create a lossless compressed representation of the third data value and the fourth data value.

19. The non-transitory computer readable medium of claim 13, wherein the instructions further comprise instructions, that when executed by the one or more hardware processors, cause the one or more hardware processors to:
identify a prediction technique used to generate the second predicted value as acceptable for continued use;
use the prediction technique to generate a third predicted value;
obtain a fourth data value representative of the parameter at a third point in time;
create an offset third predicted value by adjusting the third predicted value by the second floating point prediction error;
calculate a third floating point prediction error based on a difference between the offset third predicted value and the fourth data value; and
utilize the second floating point prediction error and the third floating point prediction error to create a lossless compressed representation of the third data value and the fourth data value.

20. The non-transitory computer readable medium of claim 19, wherein the instructions to cause the one or more hardware processors to identify the prediction technique used to generate the second predicted value as acceptable for continued use further comprise instructions to omit determination of a technique to generate the third predicted value.

* * * * *